United States Patent
Satoh

(10) Patent No.: US 10,612,134 B2
(45) Date of Patent: Apr. 7, 2020

(54) COATED CUTTING TOOL

(71) Applicant: TUNGALOY CORPORATION, Fukushima (JP)

(72) Inventor: Hiroyuki Satoh, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 225 days.

(21) Appl. No.: 15/782,331

(22) Filed: Oct. 12, 2017

(65) Prior Publication Data

US 2018/0112308 A1 Apr. 26, 2018

(30) Foreign Application Priority Data

Oct. 21, 2016 (JP) .................................. 2016-206801

(51) Int. Cl.
| | | |
|---|---|---|
| *B23B 27/14* | (2006.01) | |
| *C23C 16/40* | (2006.01) | |
| *C23C 30/00* | (2006.01) | |
| *C23C 28/04* | (2006.01) | |
| *C23C 16/02* | (2006.01) | |
| *C23C 16/36* | (2006.01) | |
| *C23C 16/34* | (2006.01) | |

(52) U.S. Cl.
CPC .......... *C23C 16/403* (2013.01); *B23B 27/146* (2013.01); *B23B 27/148* (2013.01); *C23C 16/0272* (2013.01); *C23C 16/347* (2013.01); *C23C 16/36* (2013.01); *C23C 28/042* (2013.01); *C23C 28/044* (2013.01); *C23C 30/005* (2013.01)

(58) Field of Classification Search
USPC .......... 51/307, 309; 428/216, 325, 336, 698, 428/701, 702
See application file for complete search history.

(56) References Cited

U.S. PATENT DOCUMENTS

| | | | |
|---|---|---|---|
| 5,766,782 A | 6/1998 | Ljungberg | |
| 2007/0253787 A1* | 11/2007 | Ishii | B23B 27/141 407/113 |
| 2016/0175940 A1* | 6/2016 | Lindahl | B23B 27/148 428/141 |
| 2016/0201192 A1 | 7/2016 | Tanibuchi et al. | |

FOREIGN PATENT DOCUMENTS

| | | | |
|---|---|---|---|
| EP | 3 199 277 A1 | | 8/2017 |
| JP | 08-155724 | * | 6/1996 |
| JP | H09-507528 A | | 7/1997 |
| JP | 2002-144109 | * | 5/2002 |
| JP | 2004-299023 | * | 10/2004 |
| JP | 2005-297143 | * | 10/2005 |
| JP | 5902865 B2 | | 4/2016 |

* cited by examiner

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate, the coating layer including at least one α-type aluminum oxide layer, wherein, in the α-type aluminum oxide layer, a texture coefficient TC (1,2,11) of a (1,2,11) plane is 1.4 or more.

$$TC(1, 2, 11) = \frac{I(1, 2, 11)}{I_0(1, 2, 11)} \left\{ \frac{1}{8} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to eight crystal planes of (0,1,2), (1,0,4), (1,1,0), (1,1,3), (0,2,4), (1,1,6), (2,1,4) and (1,2,11).)

9 Claims, No Drawings

COATED CUTTING TOOL

TECHNICAL FIELD

The present invention relates to a coated cutting tool.

BACKGROUND ART

It has been conventionally well known to employ, for the cutting of steel, cast iron, etc., a coated cutting tool which is obtained by depositing, via chemical vapor deposition, a coating layer with a total thickness of from 3 μm or more to 20 μm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carbonate, a Ti carboxynitride, and aluminum oxide, or consisting of multiple layers of two or more kinds selected therefrom.

As to techniques for improving the fracture resistance of a coated cutting tool, JPH09-507528 T discloses that wear and toughness properties are enhanced by controlling the particle size and thickness of an aluminum oxide layer and also by setting a texture coefficient of a (104) plane so as to be greater than 1.5.

JP5902865 B discloses a coating tool in which at least a titanium carbonitride layer and an aluminum oxide layer having an α-type crystalline structure are located, on a substrate surface, in order from the substrate side, wherein, in X-ray diffraction analysis of an aluminum oxide layer, with regard to a texture coefficient (116) represented by Tc (hkl) of the aluminum oxide layer, a surface-side Tc (116) in a surface-side peak is greater than a substrate-side Tc (116) in a substrate-side peak, where the substrate side Tc (116) is from 0.3 or more to 0.7 or less.

SUMMARY

Technical Problem

An increase in speed, feed and depth of cut have become more conspicuous in cutting in recent times, and the fracture resistance of a tool is required to be further improved compared to that involved in the prior art. In particular, in recent times, there has been a growth in cutting in which the cutting temperature is high, such as high-speed cutting of steel, and under such severe cutting conditions, a conventional cutting tool is likely to involve the progress of chemical reaction wear of a coating layer thereof. This triggers a problem in that the occurrence of crater wear and the insufficient strength of the edge result in fracturing, which does not allow the tool life to be extended.

Based on such background, when only the crystal orientation of an α-type aluminum oxide layer is controlled to achieve preferential orientation of a (104) plane or a (116) plane, as in the tools disclosed in Patent Documents 1 and 2 above, sufficient fracture resistance cannot be achieved under cutting conditions which place a large load on a coated cutting tool.

The present invention has been made in order to solve this problem, and an object of the present invention is to provide a coated cutting tool which has excellent wear resistance and fracture resistance and thereby allows the tool life to be extended.

Solution to Problem

The present inventor has conducted studies regarding extending the tool life of a coated cutting tool from the above-described perspective and has then found that the following configurations, including optimizing the crystal orientation in a predetermined plane of an α-type aluminum oxide layer, allow the wear resistance to be improved as the progress of chemical reaction wear is suppressed, and also allow the fracture resistance to be improved, and found that, as a result, the tool life of the coated cutting tool can be extended, and this has led to the completion of the present invention.

Namely, the present invention is as set forth below:

(1) A coated cutting tool comprising a substrate and a coating layer formed on a surface of the substrate, the coating layer including at least one α-type aluminum oxide layer, wherein, in the α-type aluminum oxide layer, a texture coefficient TC (1,2,11) of a (1,2,11) plane represented by formula (1) below is 1.4 or more.

$$TC(1, 2, 11) = \frac{I(1, 2, 11)}{I_0(1, 2, 11)} \left\{ \frac{1}{8} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to eight crystal planes of (0,1,2), (1,0,4), (1,1,0), (1,1,3), (0,2,4), (1,1,6), (2,1,4) and (1,2,11).)

(2) The coated cutting tool of (1), wherein, in the α-type aluminum oxide layer, the texture coefficient TC (1,2,11) is from 2.0 or more to 6.9 or less.

(3) The coated cutting tool of (1) or (2), wherein a residual stress value in a (1,1,6) plane of the α-type aluminum oxide layer is, in at least part thereof, from −300 MPa or higher to 300 MPa or lower.

(4) The coated cutting tool of any one of (1) to (3), wherein an average thickness of the α-type aluminum oxide layer is from 1.0 μm or more to 15.0 μm or less.

(5) The coated cutting tool of any one of (1) to (4), wherein the coating layer comprises a TiCN layer between the substrate and the α-type aluminum oxide layer, and a ratio $I_{311}/I_{220}$ of a peak intensity $I_{311}$ for a (3,1,1) plane in X-ray diffraction of the TiCN layer to a peak intensity $I_{220}$ for a (2,2,0) plane in X-ray diffraction of the TiCN layer is from 1.5 or more to 20.0 or less.

(6) The coated cutting tool of (5), wherein the coating layer comprises, between the TiCN layer and the α-type aluminum oxide layer, an intermediate layer comprised of a compound of at least one kind selected from the group consisting of a Ti carbonate, a Ti oxynitride and a Ti carboxynitride.

(7) The coated cutting tool of (5) or (6), wherein an average thickness of the TiCN layer is from 2.0 μm or more to 20.0 μm or less.

(8) The coated cutting tool of any one of (1) to (7), wherein an average thickness of the coating layer is from 3.0 μm or more to 30.0 μm or less.

(9) The coated cutting tool of any one of (1) to (8), wherein the coating layer comprises a TiN layer as an outermost layer on a side opposite to the substrate.

(10) The coated cutting tool of any one of (1) to (9), wherein the substrate is comprised of any of a cemented carbide, cermet, ceramics and a sintered body containing cubic boron nitride.

The present invention can provide a coated cutting tool which has excellent wear resistance and fracture resistance and thereby allows the tool life to be extended.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool according to the present embodiment comprises a substrate and a coating layer formed on a surface of the substrate. Specific examples of types of the coated cutting tool include an indexable cutting insert for milling or turning, a drill and an end mill.

The substrate in the present embodiment is not particularly limited, as long as it may be used as a substrate for the coated cutting tool. Examples of such substrate include a cemented carbide, cermet, ceramic, a sintered body containing cubic boron nitride, a diamond sintered body and high-speed steel. From among the above examples, the substrate is preferably comprised of any of a cemented carbide, cermet, ceramics and a sintered body containing cubic boron nitride, as this provides excellent wear resistance and fracture resistance, and, from the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided, even if the substrate surface has been modified in this way.

As to the coating layer in the present embodiment, the average thickness thereof is preferably from 3.0 μm or more to 30.0 μm or less. If the average thickness is 3.0 μm or more, this indicates the tendency of the wear resistance to be further improved, and if such average thickness is 30.0 μm or less, this indicates the tendency of the adhesion with the substrate of the coating layer and the fracture resistance to be further increased. From the same perspective, the average thickness of the coating layer is more preferably from 5.0 μm or more to 27.0 μm or less. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer from each of the cross-sectional surfaces at three or more locations in each layer or in the entire coating layer; and calculating the arithmetic mean of the resulting measurements.

The coating layer in the present embodiment includes at least one α-type aluminum oxide layer. In the α-type aluminum oxide layer, a texture coefficient TC (1,2,11) of a (1,2,11) plane represented by formula (1) below is 1.4 or more. When the texture coefficient TC (1,2,11) is 1.4 or more, the ratio of a peak intensity I (1,2,11) for the (1,2,11) plane is high, resulting in excellent wear resistance because chemical reaction wear can be suppressed. From the same perspective, the texture coefficient TC (1,2,11) in the α-type aluminum oxide layer is preferably 1.5 or more, is more preferably 2.0 or more, is further preferably 3.0 or more, and is particularly preferably 4.0 or more. Further, the texture coefficient TC (1,2,11) is preferably 6.9 or less.

$$TC(1, 2, 11) = \frac{I(1, 2, 11)}{I_0(1, 2, 11)} \left\{ \frac{1}{8} \sum \frac{I(h, k, l)}{I_0(h, k, l)} \right\}^{-1} \quad (1)$$

Herein, in formula (1), I (h,k,l) denotes a peak intensity for an (h,k,l) plane in X-ray diffraction of the α-type aluminum oxide layer, $I_0$ (h,k,l) denotes a standard diffraction intensity for the (h,k,l) plane which is indicated on a JCPDS Card No. 10-0173 for α-type aluminum oxide, and (h,k,l) refers to eight crystal planes of (0,1,2), (1,0,4), (1,1,0), (1,1,3), (0,2,4), (1,1,6), (2,1,4) and (1,2,11). Accordingly, I (1,2,11) denotes a peak intensity for the (1,2,11) plane in X-ray diffraction of the α-type aluminum oxide layer, and $I_0$ (1,2,11) denotes a standard diffraction intensity for the (1,2,11) plane which is indicated on a JCPDS Card No. 10-0173 for α-type aluminum oxide. It should be noted that the standard diffraction intensities for the respective crystal planes are 75.0 for a (0,1,2) plane, 90.0 for a (1,0,4) plane, 40.0 for a (1,1,0) plane, 100.0 for a (1,1,3) plane, 45.0 for a (0,2,4) plane, 80.0 for a (1,1,6) plane, 30.0 for a (2,1,4) plane and 1.0 for a (1,2,11) plane. In the present embodiment, if the texture coefficient TC (1,2,11) is 1.4 or more, this indicates the tendency of the α-type aluminum oxide layer to have preferential orientation of the (1,2,11) plane. In particular, if the texture coefficient TC (1,2,11) is 4.0 or more, the texture coefficient of the (1,2,11) plane is greater than the TC of any of the other crystal planes in light of the point that the total of the TCs of the respective crystal planes is 8.0 or more. In other words, if the texture coefficient TC (1,2,11) is 4.0 or more, the α-type aluminum oxide layer has the most preferential orientation of the (1,2,11) plane. In light of the above, the coated cutting tool of the present embodiment brings about the suppression of the progress of chemical reaction wear and the enhancement of wear resistance and further brings about the enhancement of fracture resistance, and, as a result, the tool life of the coated cutting tool can be extended.

The average thickness of the α-type aluminum oxide layer of the present embodiment is preferably from 1.0 μm or more to 15.0 μm or less. If the average thickness of the α-type aluminum oxide layer is 1.0 μm or more, this indicates the tendency of the crater wear resistance in the rake surface of the coated cutting tool to be further improved, and if such average thickness is 15.0 μm or less, this indicates the tendency of the fracture resistance of the coated cutting tool to be further improved as the peeling of the coating layer is further suppressed. From the same perspective, the average thickness of the α-type aluminum oxide layer is preferably from 1.5 μm or more to 12.0 μm or less, and is further preferably from 3.0 μm or more to 10.0 μm or less.

In the present embodiment, the residual stress value in a (1,1,6) plane of the α-type aluminum oxide layer is, at least in part thereof, preferably from −300 MPa or higher to 300 MPa or lower. If the residual stress value is −300 MPa or higher, this indicates the tendency of the wear resistance to be improved because the progress of wear—which starts from the time when particles fall off from the α-type aluminum oxide layer—can be further suppressed. Further, if the residual stress value is 300 MPa or lower, this indicates the tendency of the fracture resistance of the coated cutting tool to be further improved because the generation of cracking in the α-type aluminum oxide layer can be further suppressed. From the same perspective, the residual stress value in the (1,1,6) plane of the α-type aluminum oxide layer is more preferably from −250 MPa or higher to 250 MPa or lower.

Herein, the term "at least in part thereof" indicates that, it is not necessary to satisfy, in the entire α-type aluminum oxide layer, the above residual stress value range in the (1,1,6) plane of the α-type aluminum oxide layer, and such term also indicates that it is only required to satisfy the above residual stress value range in the (1,1,6) plane of the α-type aluminum oxide layer in a specific area such as a rake surface.

The residual stress value of the α-type aluminum oxide layer can be measured by a $\sin^2\varphi$ method using an X-ray stress measuring apparatus. It is preferable to measure, via the $\sin^2\varphi$ method, the residual stresses at any three points included in the coating layer and to obtain the arithmetic mean of the residual stresses at such three points. Any three points, serving as measurement locations, in the α-type aluminum oxide layer are preferably selected in such a way as to be 0.1 mm or more apart from one another.

In order to measure the residual stress value in the (1,1,6) plane of the α-type aluminum oxide layer, the (1,1,6) plane of the α-type aluminum oxide layer which serves as a measurement subject is selected for measurement. More specifically, a sample in which an α-type aluminum oxide layer is formed is subjected to analysis with an X-ray diffractometer. Then, an examination is conducted regarding variations in the diffraction angle of the (1,1,6) plane when a change is made to an angle φ formed by a sample plane normal and a lattice plane normal.

The α-type aluminum oxide layer is a layer comprised of α-type aluminum oxide. However, such α-type aluminum oxide layer may contain a very small amount of components other than α-type aluminum oxide, as long as it comprises the configuration of the present embodiment and provides the operation and effects of the present invention.

The coating layer of the present embodiment preferably comprises a TiCN layer between the substrate and the α-type aluminum oxide layer, as this improves wear resistance. When regarding a peak intensity for a (2,2,0) plane in X-ray diffraction of the TiCN layer as $I_{220}$ and also regarding a peak intensity for a (3,1,1) plane in X-ray diffraction of the TiCN layer as $I_{311}$, a ratio $I_{311}/I_{220}$ of $I_{311}$ to $I_{220}$ is preferably from 1.5 or more to 20.0 or less. If the $I_{311}/I_{220}$ in the TiCN layer is from 1.5 or more to 20.0 or less, this indicates the tendency of the adhesion of the TiCN layer to the α-type aluminum oxide layer to be further improved. Further, it is preferable that, if the $I_{311}/I_{220}$ in the TiCN layer is from 1.5 or more to 20.0 or less, this indicates the tendency of the texture coefficient TC (1,2,11) in the α-type aluminum oxide layer to have a greater value. From the same perspective, the ratio $I_{311}/I_{220}$ in the TiCN layer is more preferably from 2.5 or more to 20.0 or less.

The peak intensity for each crystal plane of the α-type aluminum oxide layer and the TiCN layer can be measured using a commercially available X-ray diffractometer. For instance, using model: RINT TTR III manufactured by Rigaku Corporation was used. an X-ray diffraction measurement by means of a 2θ/θ focusing optical system with Cu-Kα radiation is performed under the following conditions: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 20°-155°, whereby the peak intensity for each crystal plane can be measured. When obtaining the peak intensity for each crystal plane from an X-ray diffraction pattern, analytic software included with the X-ray diffractometer may be used. With such analytic software, background processing and $K\alpha_2$ peak removal are conducted using cubic spline, and profile fitting is conducted using Pearson-VII function, whereby each peak intensity can be obtained. It should be noted that, when various layers are formed between the α-type aluminum oxide layer and the substrate, each peak intensity can be measured by a thin-film X-ray diffraction method in order to avoid the influence of the layer. Further, when various layers are formed on a side opposite to the substrate across the α-type aluminum oxide layer, an X-ray diffraction measurement may be performed after the removal of such various layers via buffing.

The average thickness of the TiCN layer of the present embodiment is preferably from 2.0 μm or more to 20.0 μm or less. If the average thickness of the TiCN layer is 2.0 μm or more, this indicates the tendency of the wear resistance of the coated cutting tool to be further improved, and, if such average thickness is 20.0 μm or less, this indicates the tendency of the fracture resistance of the coated cutting tool to be further improved as the peeling of the coating layer is further suppressed. From the same perspective, the average thickness of the TiCN layer is more preferably from 5.0 μm or more to 15.0 μm or less.

The TiCN layer is a layer comprised of TiCN. However, such TiCN layer may contain a very small amount of components other than TiCN, as long as it comprises the above-described configuration and provides the operation and effects of the TiCN layer.

The coating layer of the present embodiment preferably includes, between the TiCN layer and the α-type aluminum oxide layer, an intermediate layer comprised of a compound of at least one kind selected from the group consisting of a Ti carbonate, a Ti oxynitride and a Ti carboxynitride as the adhesion is further improved. The average thickness of such intermediate layer is preferably from 0.2 μm or more to 1.5 μm or less. This is preferable in that: if the average thickness of the intermediate layer is 0.2 μm or more, this indicates the tendency of the adhesion to be further improved; and, if such average thickness is 1.5 μm or less, this indicates the tendency of the texture coefficient TC (1,2,11) of the (1,2,11) plane in the α-type aluminum oxide layer to have a greater value.

The intermediate layer is a layer comprised of a compound of at least one kind selected from the group consisting of a Ti carbonate, a Ti oxynitride and a Ti carboxynitride. However, such intermediate layer may contain a very small amount of components other than the above compound, as long as it comprises the above-described configuration and provides the operation and effects of the intermediate layer.

The coating layer of the present embodiment preferably comprises a TiN layer as an outermost layer on a side opposite to the substrate as this makes it possible to confirm the usage state, such as whether or not the coated cutting tool has been used, thereby leading to excellent visibility. The average thickness of the TiN layer is preferably from 0.2 μm or more to 1.0 μm or less. This is preferable in that: if the average thickness of the TiN layer is 0.2 μm or more, this provides the effect of further suppressing the falling of particles from the α-type aluminum oxide layer; and, if such average thickness is 1.0 μm or less, the fracture resistance of the coated cutting tool is improved.

The coating layer of the present embodiment preferably comprises, between the substrate and the TiCN layer, a TiN layer serving as a lowermost layer in the coating layer, as this leads to adhesion being improved. The average thickness of this TiN layer is preferably from 0.1 μm or more to 0.5 μm or less. If the average thickness of the TiN layer is 0.1 μm or more, this indicates the tendency of the adhesion to be further improved as the TiN layer has a more uniform structure. Meanwhile, if the average thickness of the TiN layer is 0.5 μm or less, this indicates the tendency of the fracture resistance to be further enhanced as the TiN layer, being the lowermost layer, is further prevented from serving as a starting point of peeling.

The TiN layers respectively serving as the outermost layer and the lowermost layer are each a layer comprised of TiN. However, such TiN layers may each contain a very small amount of components other than TiN, as long as they respectively comprise the above-described configurations and provide the operation and effects of the outermost layer and the lowermost layer.

Examples of a method of forming layers that constitute a coating layer in a coated cutting tool according to the present invention include the method set forth below. However, such method of forming layers is not limited thereto.

For instance, a TiN layer can be formed by chemical vapor deposition with a raw material gas composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 400 hPa or lower.

A TiCN layer can be formed by chemical vapor deposition with a raw material gas composition of $TiCl_4$: from 8.0 mol % or more to 18.0 mol % or less, $CH_3CN$: from 1.0 mol % or more to 3.0 mol % or less, and $H_2$: the balance, a temperature of from 900° C. or higher to 940° C. or lower, and a pressure of from 60 hPa or higher to 80 hPa or lower. At this time, the peak intensity ratio $I_{311}/I_{220}$ of the TiCN layer can be adjusted so as to fall within a range of from 1.5 or more to 20.0 or less by controlling the molar ratio of $TiCl_4$ to $CH_3CN$, i.e., $TiCl_4/CH_3CN$, so as to be from 4.0 or more to 8.0 or less.

A TiCNO layer, being a layer comprised of a Ti carboxynitride, can be formed by chemical vapor deposition with a raw material gas composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A TiCO layer, being a layer comprised of a Ti carbonate, can be formed by chemical vapor deposition with a raw material gas composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

In the present embodiment, a coated cutting tool which involves the controlled orientation (orientation relationship) of an α-type aluminum oxide layer can be obtained by, for example, the method set forth below.

Firstly, one or more layers selected from the group consisting of a TiCN layer, if necessary, a TiN layer, also if necessary, and the intermediate layer is(are) formed on a surface of a substrate. Next, from among the above layers, a surface of a layer which is most distant from the substrate is oxidized. Thereafter, a nucleus of an α-type aluminum oxide layer is formed on the surface of the layer which is most distant from the substrate, and an α-type aluminum oxide layer is then formed in the state in which such nucleus has been formed. Further, as needed, a TiN layer may be formed on a surface of the α-type aluminum oxide layer.

More specifically, the oxidation of the surface of the layer which is most distant from the substrate is performed under the conditions of a raw material gas composition of $CO_2$: from 0.1 mol % or more to 1.0 mol % or less, $C_2H_4$: from 0.05 mol % or more to 0.2 mol % or less, and $H_2$: the balance, a temperature of from 900° C. or higher to 950° C. or lower, and a pressure of from 50 hPa or higher to 70 hPa or lower. Here, the oxidation time is preferably from 5 minutes or more to 10 minutes or less.

Thereafter, the nucleus of the α-type aluminum oxide layer is formed by chemical vapor deposition with a raw material gas composition of $AlCl_3$: from 2.0 mol % or more to 5.0 mol % or less, 002: from 2.5 mol % or more to 4.0 mol % or less, HCl: from 2.0 mol % or more to 3.0 mol % or less, $C_3H_6$: from 0.05 mol % or more to 0.2 mol % or less, and $H_2$: the balance, a temperature of from 970° C. or higher to 1,030° C. or lower, and a pressure of from 60 hPa or higher to 80 hPa or lower.

The α-type aluminum oxide layer is then formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 970° C. or higher to 1,030° C. or lower, and a pressure of from 60 hPa or higher to 80 hPa or lower.

As described above, a surface of the TiN layer, the TiCN layer or the intermediate layer is oxidized, the nucleus of the α-type aluminum oxide layer is then formed, and the α-type aluminum oxide layer is then formed with normal conditions, thereby making it possible to obtain an α-type aluminum oxide layer with a texture coefficient TC (1,2,11) of 1.4 or more. At this time, it is preferable that a surface of a TiCN layer with a peak intensity ratio $I_{311}/I_{220}$ of from 1.5 or more to 20.0 or less is oxidized, and that a nucleus of an α-type aluminum oxide layer is then formed thereon, because this indicates the tendency of the texture coefficient TC (1,2,11) of the α-type aluminum oxide layer to be increased.

After the formation of the coating layer, dry shot blasting, wet shot blasting or shot peening is performed thereon, and the conditions are adjusted, thereby making it possible to control the residual stress value in a (1,1,6) plane of the α-type aluminum oxide layer. For instance, as to the conditions for dry shot blasting, a shot material may be shot onto a surface of the coating layer at a shot velocity of from 50 m/sec or more to 80 m/sec or less and for a shot time of from 0.5 minutes or more to 3 minutes or less so as to achieve a shot angle of from 30° or more to 70° or less. From the perspective of easily controlling the residual stress value so as to fall within the above range, the shot material (medium) in dry shot blasting is preferably a material(s) of one or more kinds, each of which has an average particle size of from 100 μm or more to 150 μm or less and is(are) selected from the group consisting of $Al_2O_3$ and $ZrO_2$.

The thickness of each layer in the coating layer of the coated cutting tool of the present embodiment can be measured by observing a cross-sectional structure of the coated cutting tool, using an optical microscope, a scanning electron microscope (SEM), a field emission scanning electron microscope (FE-SEM), or the like. It should be noted that, as to the average thickness of each layer in the coated cutting tool of the present embodiment, such average thickness can be obtained by: measuring the thickness of each layer at three or more locations near the position 50 µm from the edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS) or the like.

EXAMPLES

Although the present invention will be described in further detail below, with examples, the present invention is not limited to such examples.

A cemented carbide cutting insert with a shape of JIS certified CNMA120412 and a composition of 93.1WC-6.400-0.5Cr$_3$C$_2$ (mass %) was prepared as a substrate. The edge of such substrate was subjected to round honing by means of an SiC brush, and a surface of the substrate was then washed.

After the substrate surface was washed, a coating layer was formed by chemical vapor deposition. As to invention samples 1 to 17, firstly, the substrate was inserted into an external heating chemical vapor deposition apparatus, and a lowermost layer, whose composition is shown in Table 6, was formed on the substrate surface so as to have the average thickness shown in Table 6 under the raw material gas composition, temperature and pressure conditions shown in Table 1. Then, a TiCN layer, whose composition is shown in Table 6, was formed on the surface of the lowermost layer so as to have the average thickness shown in Table 6 under the raw material gas composition, temperature and pressure conditions shown in Table 2. Next, an intermediate layer, whose composition is shown in Table 6, was formed on the surface of the TiCN layer so as to have the average thickness shown in Table 6 under the raw material gas composition, temperature and pressure conditions shown in Table 1. Thereafter, a surface of the intermediate layer was oxidized for the time shown in Table 3, under the raw material gas composition, temperature and pressure conditions shown in Table 3. Then, a nucleus of α-type aluminum oxide was formed on the oxidized surface of the intermediate layer under the raw material gas composition, temperature and pressure conditions concerning the "nucleus formation conditions" shown in Table 4. Further, an α-type aluminum oxide layer, whose composition is shown in Table 6, was formed on the surface of the intermediate layer and the surface of the nucleus of α-type aluminum oxide so as to have the average thickness shown in Table 6 under the raw material gas composition, temperature and pressure conditions concerning the "deposition conditions" shown in Table 4. Lastly, an outermost layer, whose composition is shown in Table 6, was formed on the surface of the α-type aluminum oxide layer so as to have the average thickness shown in Table 6 under the raw material gas composition, temperature and pressure conditions shown in Table 1. As a result, the coated cutting tools of invention samples 1 to 17 were obtained.

Meanwhile, as to comparative samples 1 to 14, firstly, the substrate was inserted into an external heating chemical vapor deposition apparatus, and a lowermost layer, whose composition is shown in Table 6, was formed on the substrate surface so as to have the average thickness shown in Table 6 under the raw material gas composition, temperature and pressure conditions shown in Table 1. Then, a TiCN layer, whose composition is shown in Table 6, was formed on the surface of the lowermost layer so as to have the average thickness shown in Table 6 under the raw material gas composition, temperature and pressure conditions shown in Table 2. Next, an intermediate layer, whose composition is shown in Table 6, was formed on the surface of the TiCN layer so as to have the average thickness shown in Table 6 under the raw material gas composition, temperature and pressure conditions shown in Table 1. Thereafter, the surface of the intermediate layer was oxidized for the time shown in Table 3, under the raw material gas composition, temperature and pressure conditions shown in Table 3. Then, a nucleus of α-type aluminum oxide was formed on the oxidized surface of the intermediate layer under the raw material gas composition, temperature and pressure conditions concerning the "nucleus formation conditions" shown in Table 5. Further, an α-type aluminum oxide layer, whose composition is shown in Table 6, was formed on the surface of the intermediate layer and the surface of the nucleus of α-type aluminum oxide so as to have the average thickness shown in Table 6 under the raw material gas composition, temperature and pressure conditions concerning the "deposition conditions" shown in Table 5. Lastly, an outermost layer, whose composition is shown in Table 6, was formed on the surface of the α-type aluminum oxide layer so as to have the average thickness shown in Table 6 under the raw material gas composition, temperature and pressure conditions shown in Table 1. As a result, the coated cutting tools of comparative samples 1 to 14 were obtained.

The thickness of each layer of each of the samples was obtained as set forth below. That is, using an FE-SEM, the average thickness was obtained by: measuring the thickness of each layer, from each of the cross-sectional surfaces at three locations near the position 50 µm from the edge of the coated cutting tool, toward the center of the rake surface thereof; and calculating the arithmetic mean of the resulting measurements. Using an EDS, the composition of each layer of the obtained sample was measured from the cross-sectional surface near the position at most 50 µm from the edge of the coated cutting tool, toward the center of the rake surface thereof.

TABLE 1

| Each layer composition | Temperature (° C.) | Pressure (hPa) | Raw material gas composition (mol %) |
|---|---|---|---|
| TiN | 900 | 400 | TiCl$_4$: 7.5%, N$_2$: 40.0%, H$_2$: 52.5% |
| TiC | 1,000 | 75 | TiCl$_4$: 2.4%, CH$_4$: 4.6%, H$_2$: 93.0% |
| TiCNO | 1,000 | 100 | TiCl$_4$: 3.5%, CO: 0.7%, N$_2$: 35.5%, H$_2$: 60.3% |
| TiCO | 1,000 | 80 | TiCl$_4$: 1.3%, CO: 2.7%, H$_2$: 96.0% |

TABLE 2

| Sample No. | Temperature (° C.) | Pressure (hPa) | Raw material gas composition (mol %) |
|---|---|---|---|
| Invention sample 1 | 920 | 60 | TiCl$_4$: 11.0%, CH$_3$CN: 2.5%, H$_2$: 86.5% |
| Invention sample 2 | 920 | 70 | TiCl$_4$: 12.0%, CH$_3$CN: 2.2%, H$_2$: 85.8% |
| Invention sample 3 | 890 | 70 | TiCl$_4$: 12.0%, CH$_3$CN: 2.2%, H$_2$: 85.8% |
| Invention sample 4 | 920 | 80 | TiCl$_4$: 10.0%, CH$_3$CN: 1.4%, H$_2$: 88.6% |

TABLE 2-continued

| Sample No. | Temperature (° C.) | Pressure (hPa) | Raw material gas composition (mol %) |
|---|---|---|---|
| Invention sample 5 | 920 | 70 | $TiCl_4$: 12.0%, $CH_3CN$: 2.2%, $H_2$: 85.8% |
| Invention sample 6 | 920 | 80 | $TiCl_4$: 12.0%, $CH_3CN$: 3.0%, $H_2$: 85.0% |
| Invention sample 7 | 920 | 70 | $TiCl_4$: 12.0%, $CH_3CN$: 2.2%, $H_2$: 85.8% |
| Invention sample 8 | 920 | 70 | $TiCl_4$: 8.0%, $CH_3CN$: 2.0%, $H_2$: 90.0% |
| Invention sample 9 | 940 | 70 | $TiCl_4$: 12.0%, $CH_3CN$: 2.2%, $H_2$: 85.8% |
| Invention sample 10 | 920 | 70 | $TiCl_4$: 11.0%, $CH_3CN$: 2.0%, $H_2$: 87.0% |
| Invention sample 11 | 920 | 70 | $TiCl_4$: 18.0%, $CH_3CN$: 2.3%, $H_2$: 79.7% |
| Invention sample 12 | 920 | 70 | $TiCl_4$: 12.0%, $CH_3CN$: 2.2%, $H_2$: 85.8% |
| Invention sample 13 | 920 | 70 | $TiCl_4$: 12.0%, $CH_3CN$: 2.2%, $H_2$: 85.8% |
| Invention sample 14 | 920 | 70 | $TiCl_4$: 12.0%, $CH_3CN$: 2.2%, $H_2$: 85.8% |
| Invention sample 15 | 920 | 70 | $TiCl_4$: 12.0%, $CH_3CN$: 2.2%, $H_2$: 85.8% |
| Invention sample 16 | 920 | 70 | $TiCl_4$: 12.0%, $CH_3CN$: 2.2%, $H_2$: 85.8% |
| Invention sample 17 | 920 | 60 | $TiCl_4$: 11.0%, $CH_3CN$: 2.5%, $H_2$: 86.5% |
| Comparative sample 1 | 920 | 70 | $TiCl_4$: 11.0%, $CH_3CN$: 2.5%, $H_2$: 86.5% |
| Comparative sample 2 | 920 | 70 | $TiCl_4$: 8.0%, $CH_3CN$: 2.0%, $H_2$: 90.0% |
| Comparative sample 3 | 890 | 70 | $TiCl_4$: 10.0%, $CH_3CN$: 2.0%, $H_2$: 88.0% |
| Comparative sample 4 | 940 | 70 | $TiCl_4$: 10.0%, $CH_3CN$: 2.0%, $H_2$: 88.0% |
| Comparative sample 5 | 920 | 70 | $TiCl_4$: 10.0%, $CH_3CN$: 2.2%, $H_2$: 87.8% |
| Comparative sample 6 | 920 | 70 | $TiCl_4$: 12.0%, $CH_3CN$: 2.2%, $H_2$: 85.8% |
| Comparative sample 7 | 920 | 70 | $TiCl_4$: 14.0%, $CH_3CN$: 3.0%, $H_2$: 83.0% |
| Comparative sample 8 | 920 | 70 | $TiCl_4$: 14.0%, $CH_3CN$: 2.7%, $H_2$: 83.3% |
| Comparative sample 9 | 920 | 60 | $TiCl_4$: 8.0%, $CH_3CN$: 1.5%, $H_2$: 90.5% |
| Comparative sample 10 | 920 | 90 | $TiCl_4$: 10.0%, $CH_3CN$: 1.4%, $H_2$: 88.6% |
| Comparative sample 11 | 920 | 70 | $TiCl_4$: 12.0%, $CH_3CN$: 2.2%, $H_2$: 85.8% |
| Comparative sample 12 | 920 | 70 | $TiCl_4$: 12.0%, $CH_3CN$: 2.2%, $H_2$: 85.8% |
| Comparative sample 13 | 920 | 70 | $TiCl_4$: 12.0%, $CH_3CN$: 2.2%, $H_2$: 85.8% |
| Comparative sample 14 | 920 | 60 | $TiCl_4$: 11.0%, $CH_3CN$: 2.5%, $H_2$: 86.5% |

TABLE 3

| Sample No. | Temperature (° C.) | Pressure (hPa) | Raw material gas composition (mol %) | Hour (min) |
|---|---|---|---|---|
| Invention sample 1 | 930 | 50 | $CO_2$: 0.5%, $C_2H_4$: 0.1%, $H_2$: 99.4% | 5 |
| Invention sample 2 | 930 | 60 | $CO_2$: 0.7%, $C_2H_4$: 0.1%, $H_2$: 99.2% | 6 |
| Invention sample 3 | 930 | 60 | $CO_2$: 0.5%, $C_2H_4$: 0.15%, $H_2$: 99.35% | 8 |
| Invention sample 4 | 950 | 60 | $CO_2$: 0.5%, $C_2H_4$: 0.1%, $H_2$: 99.4% | 9 |
| Invention sample 5 | 930 | 70 | $CO_2$: 0.7%, $C_2H_4$: 0.1%, $H_2$: 99.2% | 7 |
| Invention sample 6 | 900 | 60 | $CO_2$: 1.0%, $C_2H_4$: 0.1%, $H_2$: 98.9% | 6 |
| Invention sample 7 | 930 | 60 | $CO_2$: 0.5%, $C_2H_4$: 0.1%, $H_2$: 99.4% | 6 |
| Invention sample 8 | 900 | 60 | $CO_2$: 0.1%, $C_2H_4$: 0.1%, $H_2$: 99.8% | 5 |
| Invention sample 9 | 930 | 60 | $CO_2$: 0.7%, $C_2H_4$: 0.1%, $H_2$: 99.2% | 6 |
| Invention sample 10 | 930 | 50 | $CO_2$: 0.7%, $C_2H_4$: 0.1%, $H_2$: 99.2% | 8 |
| Invention sample 11 | 950 | 60 | $CO_2$: 0.5%, $C_2H_4$: 0.2%, $H_2$: 99.3% | 10 |
| Invention sample 12 | 930 | 50 | $CO_2$: 0.5%, $C_2H_4$: 0.1%, $H_2$: 99.4% | 5 |
| Invention sample 13 | 930 | 60 | $CO_2$: 0.7%, $C_2H_4$: 0.1%, $H_2$: 99.2% | 6 |
| Invention sample 14 | 950 | 60 | $CO_2$: 0.5%, $C_2H_4$: 0.2%, $H_2$: 99.3% | 10 |
| Invention sample 15 | 930 | 60 | $CO_2$: 0.7%, $C_2H_4$: 0.1%, $H_2$: 99.2% | 6 |
| Invention sample 16 | 930 | 60 | $CO_2$: 0.7%, $C_2H_4$: 0.1%, $H_2$: 99.2% | 6 |
| Invention sample 17 | 930 | 60 | $CO_2$: 0.7%, $C_2H_4$: 0.1%, $H_2$: 99.2% | 6 |
| Comparative sample 1 | 930 | 60 | $CO_2$: 0.7%, $H_2$: 99.3% | 5 |
| Comparative sample 2 | 930 | 50 | $CO_2$: 0.7%, $H_2$: 99.3% | 7 |
| Comparative sample 3 | 930 | 60 | $CO_2$: 0.9%, $H_2$: 99.1% | 5 |
| Comparative sample 4 | 930 | 60 | $CO_2$: 0.1%, $H_2$: 99.9% | 10 |
| Comparative sample 5 | 930 | 70 | $CO_2$: 0.5%, $H_2$: 99.5% | 5 |
| Comparative sample 6 | 930 | 60 | $CO_2$: 0.2%, $C_2H_4$: 0.05%, $H_2$: 99.75% | 2 |
| Comparative sample 7 | 900 | 60 | $CO_2$: 0.5%, $H_2$: 99.5% | 5 |
| Comparative sample 8 | 930 | 60 | $CO_2$: 0.7%, $H_2$: 99.3% | 6 |
| Comparative sample 9 | 930 | 60 | $CO_2$: 0.7%, $H_2$: 99.3% | 5 |
| Comparative sample 10 | 950 | 60 | $CO_2$: 0.5%, $H_2$: 99.5% | 8 |
| Comparative sample 11 | 930 | 60 | $CO_2$: 0.7%, $H_2$: 99.3% | 5 |
| Comparative sample 12 | 930 | 60 | $CO_2$: 0.7%, $H_2$: 99.3% | 5 |
| Comparative sample 13 | 930 | 60 | $CO_2$: 0.7%, $H_2$: 99.3% | 5 |
| Comparative sample 14 | 930 | 60 | $CO_2$: 0.7%, $H_2$: 99.3% | 5 |

TABLE 4

| | Nucleus formation conditions | | | Deposition conditions | | |
|---|---|---|---|---|---|---|
| Sample No. | Temperature (° C.) | Pressure (hPa) | Raw material gas composition (mol %) | Temperature (° C.) | Pressure (hPa) | Raw material gas composition (mol %) |
| Invention sample 1 | 1,000 | 60 | $AlCl_3$: 3.2%, $CO_2$: 3.4%, HCl: 2.5%, $C_3H_6$: 0.1%, $H_2$: 90.8% | 1,000 | 60 | $AlCl_3$: 2.4%, $CO_2$: 2.6%, HCl: 2.7%, $H_2S$: 0.2%, $H_2$: 92.1% |
| Invention sample 2 | 1,000 | 70 | $AlCl_3$: 4.2%, $CO_2$: 3.0%, HCl: 2.5%, $C_3H_6$: 0.15%, $H_2$: 90.15% | 1,000 | 70 | $AlCl_3$: 2.8%, $CO_2$: 2.6%, HCl: 2.5%, $H_2S$: 0.2%, $H_2$: 91.9% |
| Invention sample 3 | 1,000 | 70 | $AlCl_3$: 4.2%, $CO_2$: 3.0%, HCl: 2.5%, $C_3H_6$: 0.15%, $H_2$: 90.15% | 1,000 | 70 | $AlCl_3$: 2.8%, $CO_2$: 2.6%, HCl: 2.5%, $H_2S$: 0.2%, $H_2$: 91.9% |
| Invention sample 4 | 1,020 | 70 | $AlCl_3$: 2.6%, $CO_2$: 3.4%, HCl: 2.5%, $C_3H_6$: 0.2%, $H_2$: 91.3% | 1,020 | 70 | $AlCl_3$: 4.8%, $CO_2$: 2.5%, HCl: 2.7%, $H_2S$: 0.15%, $H_2$: 89.85% |
| Invention sample 5 | 1,000 | 70 | $AlCl_3$: 3.2%, $CO_2$: 3.4%, HCl: 2.5%, $C_3H_6$: 0.1%, $H_2$: 90.8% | 1,000 | 70 | $AlCl_3$: 2.8%, $CO_2$: 2.6%, HCl: 2.5%, $H_2S$: 0.2%, $H_2$: 91.9% |
| Invention sample 6 | 970 | 70 | $AlCl_3$: 5.0%, $CO_2$: 2.5%, HCl: 2.4%, $C_3H_6$: 0.1%, $H_2$: 90.0% | 970 | 70 | $AlCl_3$: 2.0%, $CO_2$: 4.0%, HCl: 2.0%, $H_2S$: 0.25%, $H_2$: 91.75% |
| Invention sample 7 | 1,000 | 80 | $AlCl_3$: 3.2%, $CO_2$: 3.4%, HCl: 2.5%, $C_3H_6$: 0.1%, $H_2$: 90.8% | 1,000 | 80 | $AlCl_3$: 2.4%, $CO_2$: 2.6%, HCl: 2.7%, $H_2S$: 0.2%, $H_2$: 92.1% |
| Invention sample 8 | 970 | 60 | $AlCl_3$: 3.2%, $CO_2$: 3.4%, HCl: 2.5%, $C_3H_6$: 0.1%, $H_2$: 90.8% | 970 | 60 | $AlCl_3$: 2.4%, $CO_2$: 2.6%, HCl: 2.7%, $H_2S$: 0.2%, $H_2$: 92.1% |
| Invention sample 9 | 1,000 | 60 | $AlCl_3$: 3.2%, $CO_2$: 3.4%, HCl: 2.5%, $C_3H_6$: 0.1%, $H_2$: 90.8% | 1,000 | 60 | $AlCl_3$: 2.8%, $CO_2$: 2.6%, HCl: 2.5%, $H_2S$: 0.2%, $H_2$: 91.9% |
| Invention sample 10 | 1,000 | 70 | $AlCl_3$: 2.0%, $CO_2$: 4.0%, HCl: 2.0%, $C_3H_6$: 0.1%, $H_2$: 91.9% | 1,000 | 70 | $AlCl_3$: 2.8%, $CO_2$: 2.6%, HCl: 2.5%, $H_2S$: 0.2%, $H_2$: 91.9% |
| Invention sample 11 | 1,020 | 70 | $AlCl_3$: 2.6%, $CO_2$: 3.4%, HCl: 2.5%, $C_3H_6$: 0.2%, $H_2$: 91.3% | 1,020 | 70 | $AlCl_3$: 4.8%, $CO_2$: 2.5%, HCl: 2.7%, $H_2S$: 0.15%, $H_2$: 89.85% |
| Invention sample 12 | 1,000 | 60 | $AlCl_3$: 3.2%, $CO_2$: 3.4%, HCl: 2.5%, $C_3H_6$: 0.1%, $H_2$: 90.8% | 1,000 | 60 | $AlCl_3$: 2.4%, $CO_2$: 2.6%, HCl: 2.7%, $H_2S$: 0.2%, $H_2$: 92.1% |
| Invention sample 13 | 1,000 | 70 | $AlCl_3$: 4.2%, $CO_2$: 3.0%, HCl: 2.5%, $C_3H_6$: 0.15%, $H_2$: 90.15% | 1,000 | 70 | $AlCl_3$: 2.8%, $CO_2$: 2.6%, HCl: 2.5%, $H_2S$: 0.2%, $H_2$: 91.9% |
| Invention sample 14 | 1,020 | 70 | $AlCl_3$: 2.6%, $CO_2$: 3.4%, HCl: 2.5%, $C_3H_6$: 0.2%, $H_2$: 91.3% | 1,020 | 70 | $AlCl_3$: 4.8%, $CO_2$: 2.5%, HCl: 2.7%, $H_2S$: 0.15%, $H_2$: 89.85% |
| Invention sample 15 | 1,000 | 70 | $AlCl_3$: 4.2%, $CO_2$: 3.0%, HCl: 2.5%, $C_3H_6$: 0.15%, $H_2$: 90.15% | 1,000 | 70 | $AlCl_3$: 2.8%, $CO_2$: 2.6%, HCl: 2.5%, $H_2S$: 0.2%, $H_2$: 91.9% |
| Invention sample 16 | 1,000 | 70 | $AlCl_3$: 4.2%, $CO_2$: 3.0%, HCl: 2.5%, $C_3H_6$: 0.15%, $H_2$: 90.15% | 1,000 | 70 | $AlCl_3$: 2.8%, $CO_2$: 2.6%, HCl: 2.5%, $H_2S$: 0.2%, $H_2$: 91.9% |
| ention sample 17 | 1,000 | 70 | $AlCl_3$: 4.2%, $CO_2$: 3.0%, HCl: 2.5%, $C_3H_6$: 0.15%, $H_2$: 90.15% | 1,000 | 70 | $AlCl_3$: 2.8%, $CO_2$: 2.6%, HCl: 2.5%, $H_2S$: 0.2%, $H_2$: 91.9% |

TABLE 5

| | Nucleus formation conditions | | | Deposition conditions | | |
|---|---|---|---|---|---|---|
| Sample No. | Temperature (° C.) | Pressure (hPa) | Raw material gas composition (mol %) | Temperature (° C.) | Pressure (hPa) | Raw material gas composition (mol %) |
| Comparative sample 1 | 1,000 | 60 | $AlCl_3$: 2.4%, $CO_2$: 3.6%, HCl: 2.6%, $H_2$: 91.4% | 1,000 | 60 | $AlCl_3$: 2.8%, $CO_2$: 2.6%, HCl: 2.5%, $H_2S$: 0.2%, $H_2$: 91.9% |
| Comparative sample 2 | 1,000 | 70 | $AlCl_3$: 2.4%, $CO_2$: 3.6%, HCl: 2.6%, $H_2$: 91.4% | 1,000 | 70 | $AlCl_3$: 2.4%, $CO_2$: 2.6%, HCl: 2.7%, $H_2S$: 0.2%, $H_2$: 92.1% |
| Comparative sample 3 | 1,000 | 70 | $AlCl_3$: 2.4%, $CO_2$: 3.6%, HCl: 2.6%, $C_3H_6$: 0.2%, $H_2$: 90.9% | 1,000 | 70 | $AlCl_3$: 2.4%, $CO_2$: 2.6%, HCl: 2.7%, $H_2S$: 0.2%, $H_2$: 92.1% |
| Comparative sample 4 | 1,020 | 70 | $AlCl_3$: 2.4%, $CO_2$: 3.6%, HCl: 2.6%, $H_2$: 91.4% | 1,020 | 70 | $AlCl_3$: 4.6%, $CO_2$: 2.5%, HCl: 2.4%, $H_2S$: 0.15%, $H_2$: 90.35% |
| Comparative samples | 1,000 | 70 | $AlCl_3$: 2.4%, $CO_2$: 3.6%, HCl: 2.6%, $H_2$: 91.4% | 1,000 | 70 | $AlCl_3$: 2.4%, $CO_2$: 2.6%, HCl: 2.7%, $H_2S$: 0.2%, $H_2$: 92.1% |
| Comparative sample 6 | 1,000 | 70 | $AlCl_3$: 2.4%, $CO_2$: 3.6%, HCl: 2.6%, $C_3H_6$: 0.1%, $H_2$: 91.3% | 1,000 | 70 | $AlCl_3$: 2.4%, $CO_2$: 2.6%, HCl: 2.7%, $H_2S$: 0.2%, $H_2$: 92.1% |
| Comparative sample 7 | 1,000 | 80 | $AlCl_3$: 4.8%, $CO_2$: 2.5%, HCl: 2.2%, $H_2$: 90.5% | 1,000 | 80 | $AlCl_3$: 2.0%, $CO_2$: 4.0%, HCl: 1.5%, $H_2S$: 0.25%, $H_2$: 92.25% |
| Comparative sample 8 | 970 | 60 | $AlCl_3$: 2.4%, $CO_2$: 3.6%, HCl: 2.6%, $H_2$: 91.4% | 970 | 60 | $AlCl_3$: 2.8%, $CO_2$: 2.6%, HCl: 2.5%, $H_2S$: 0.2%, $H_2$: 91.9% |
| Comparative sample 9 | 1,000 | 60 | $AlCl_3$: 2.0%, $CO_2$: 4.0%, HCl: 3.5%, $H_2$: 90.5% | 1,000 | 60 | $AlCl_3$: 2.8%, $CO_2$: 2.6%, HCl: 2.5%, $H_2S$: 0.2%, $H_2$: 91.9% |
| Comparative sample 10 | 1,000 | 70 | $AlCl_3$: 2.4%, $CO_2$: 3.6%, HCl: 2.6%, $H_2$: 91.4% | 1,000 | 70 | $AlCl_3$: 2.4%, $CO_2$: 2.6%, HCl: 2.7%, $H_2S$: 0.2%, $H_2$: 92.1% |
| Comparative sample 11 | 1,000 | 60 | $AlCl_3$: 2.4%, $CO_2$: 3.6%, HCl: 2.6%, $H_2$: 91.4% | 1,000 | 60 | $AlCl_3$: 2.8%, $CO_2$: 2.6%, HCl: 2.5%, $H_2S$: 0.2%, $H_2$: 91.9% |
| Comparative sample 12 | 1,000 | 60 | $AlCl_3$: 2.4%, $CO_2$: 3.6%, HCl: 2.6%, $H_2$: 91.4% | 1,000 | 60 | $AlCl_3$: 2.8%, $CO_2$: 2.6%, HCl: 2.5%, $H_2S$: 0.2%, $H_2$: 91.9% |
| Comparative sample 13 | 1,000 | 60 | $AlCl_3$: 2.4%, $CO_2$: 3.6%, HCl: 2.6%, $H_2$: 91.4% | 1,000 | 60 | $AlCl_3$: 2.8%, $CO_2$: 2.6%, HCl: 2.5%, $H_2S$: 0.2%, $H_2$: 91.9% |
| Comparative sample 14 | 1,000 | 60 | $AlCl_3$: 2.4%, $CO_2$: 3.6%, HCl: 2.6%, $H_2$: 91.4% | 1,000 | 60 | $AlCl_3$: 2.8%, $CO_2$: 2.6%, HCl: 2.5%, $H_2S$: 0.2%, $H_2$: 91.9% |

TABLE 6

| | Coating layer | | | | | | | | | |
|---|---|---|---|---|---|---|---|---|---|---|
| | Lowermost layer | | TiCN layer | | Intermediate layer | | α-type aluminum oxide layer | | Outermost layer | |
| Sample No. | Composition | Average thickness (μm) | Composition | Average thickness (μm) | Composition | Average thickness (μm) | Crystal system | Average thickness (μm) | Composition | Average thickness (μm) | Total thickness (μm) |
|---|---|---|---|---|---|---|---|---|---|---|---|
| Invention sample 1 | TiN | 0.2 | TiCN | 6.4 | TiCO | 0.3 | α | 5.0 | TiN | 0.3 | 12.2 |
| Invention sample 2 | TiN | 0.2 | TiCN | 2.2 | TiCNO | 0.3 | α | 12.0 | TiN | 0.3 | 15.0 |
| Invention sample 3 | TiN | 0.3 | TiCN | 14.0 | TiCO | 0.2 | α | 2.4 | TiN | 0.5 | 17.4 |
| Invention sample 4 | TiN | 0.3 | TiCN | 20.0 | TiCNO | 0.1 | α | 6.0 | TiN | 0.5 | 26.9 |
| Invention sample 5 | TiN | 0.5 | TiCN | 10.0 | TiCNO | 0.3 | α | 7.5 | TiN | 0.3 | 18.6 |
| Invention sample 6 | TiN | 0.5 | TiCN | 7.2 | TiCNO | 0.7 | α | 7.5 | TiN | 0.5 | 16.4 |
| Invention sample 7 | TiN | 1.2 | TiCN | 7.2 | TiCO | 0.3 | α | 10.0 | TiN | 0.2 | 18.9 |
| Invention sample 8 | TiC | 1.2 | TiCN | 10.0 | TiCNO | 0.5 | α | 10.0 | TiN | 0.3 | 22.0 |
| Invention sample 9 | TiC | 0.3 | TiCN | 5.0 | TiCNO | 0.5 | α | 5.5 | TiN | 0.2 | 11.5 |
| Invention sample 10 | TiN | 0.8 | TiCN | 5.0 | TiCNO | 1.0 | α | 15.0 | TiN | 0.2 | 22.0 |
| Invention sample 11 | TiN | 0.2 | TiCN | 3.0 | TiCO | 0.5 | α | 4.0 | TiN | 0.3 | 8.0 |
| Invention sample 12 | TiN | 0.2 | TiCN | 6.0 | TiCNO | 0.2 | α | 9.0 | TiN | 0.5 | 15.9 |
| Invention sample 13 | TiN | 0.2 | TiCN | 6.0 | TiCNO | 0.2 | α | 9.0 | TiN | 0.5 | 15.9 |
| Invention sample 14 | TiN | 0.2 | TiCN | 6.0 | TiCNO | 0.2 | α | 9.0 | TiN | 0.5 | 15.9 |
| Invention sample 15 | TiN | 0.2 | TiCN | 11.0 | TiCNO | 0.2 | α | 4.2 | TiN | 0.5 | 16.1 |
| Invention sample 16 | TiN | 0.2 | TiCN | 6.0 | TiCNO | 0.2 | α | 9.0 | TiN | 0.5 | 15.9 |
| Invention sample 17 | TiN | 0.2 | TiCN | 6.0 | TiCNO | 0.2 | α | 9.0 | TiN | 0.5 | 15.9 |
| Comparative sample 1 | TiN | 0.2 | TiCN | 6.4 | TiCNO | 0.5 | α | 5.5 | TiN | 0.3 | 12.9 |
| Comparative sample 2 | TiN | 0.2 | TiCN | 5.5 | TiCNO | 0.5 | α | 11.0 | TiN | 0.3 | 17.5 |
| Comparative sample 3 | TiC | 0.3 | TiCN | 20.0 | TiCNO | 0.1 | α | 3.0 | TiN | 0.5 | 23.9 |
| Comparative sample 4 | TiC | 0.3 | TiCN | 2.2 | TiCNO | 0.1 | α | 4.5 | TiN | 0.3 | 7.4 |
| Comparative sample 5 | TiN | 0.5 | TiCN | 5.5 | TiCNO | 0.2 | α | 6.5 | TiN | 0.3 | 13.0 |
| Comparative sample 6 | TiN | 0.5 | TiCN | 16.0 | TiCNO | 0.2 | α | 5.5 | TiN | 0.2 | 22.4 |
| Comparative sample 7 | TiN | 0.2 | TiCN | 6.4 | TiCNO | 0.3 | α | 15.0 | TiN | 0.3 | 22.2 |
| Comparative sample 8 | TiN | 0.8 | TiCN | 10.0 | TiCO | 0.3 | α | 10.0 | TiN | 0.3 | 21.4 |
| Comparative sample 9 | TiN | 1.2 | TiCN | 10.0 | TiCNO | 0.3 | α | 5.0 | TiN | 0.3 | 16.8 |
| Comparative sample 10 | TiN | 1.2 | TiCN | 5.0 | TiCNO | 1.0 | α | 10.0 | TiN | 0.3 | 17.5 |
| Comparative sample 11 | TiN | 0.2 | TiCN | 6.0 | TiCNO | 0.2 | α | 9.0 | TiN | 0.5 | 15.9 |
| Comparative sample 12 | TiN | 0.2 | TiCN | 11.0 | TiCNO | 0.2 | α | 4.2 | TiN | 0.5 | 16.1 |
| Comparative sample 13 | TiN | 0.2 | TiCN | 6.0 | TiCNO | 0.2 | α | 9.0 | TiN | 0.5 | 15.9 |
| Comparative sample 14 | TiN | 0.2 | TiCN | 6.0 | TiCNO | 0.2 | α | 9.0 | TiN | 0.5 | 15.9 |

As to invention samples 1 to 17 and comparative samples 1 to 14, after the formation of the coating layer on the surface of the substrate, dry shot blasting was performed on a surface of the coating layer under the shot conditions shown in Table 7, using the shot material shown in Table 7.

TABLE 7

| Sample No. | Shot material Material | Average particle size (μm) | Shot conditions Shot angle (°) | Shot velocity (m/sec) | Shot time (min) |
|---|---|---|---|---|---|
| Invention sample 1 | $Al_2O_3$ | 120 | 50 | 70 | 2.5 |
| Invention sample 2 | $Al_2O_3$ | 120 | 50 | 70 | 2.5 |
| Invention sample 3 | $Al_2O_3$ | 120 | 50 | 70 | 3.0 |
| Invention sample 4 | $ZrO_2$ | 120 | 70 | 70 | 2.0 |
| Invention sample 5 | $ZrO_2$ | 120 | 70 | 70 | 2.0 |
| Invention sample 6 | $Al_2O_3$ | 120 | 50 | 60 | 1.0 |
| Invention sample 7 | $Al_2O_3$ | 120 | 50 | 60 | 1.0 |
| Invention sample 8 | $Al_2O_3$ | 120 | 50 | 60 | 1.0 |
| Invention sample 9 | $Al_2O_3$ | 100 | 40 | 50 | 1.0 |
| Invention sample 10 | $Al_2O_3$ | 150 | 70 | 70 | 3.0 |
| Invention sample 11 | $Al_2O_3$ | 150 | 60 | 80 | 1.5 |
| Invention sample 12 | $Al_2O_3$ | 120 | 50 | 70 | 2.5 |
| Invention sample 13 | $Al_2O_3$ | 120 | 50 | 70 | 2.5 |
| Invention sample 14 | $Al_2O_3$ | 120 | 50 | 70 | 2.5 |
| Invention sample 15 | $Al_2O_3$ | 120 | 50 | 70 | 2.5 |
| Invention sample 16 | $Al_2O_3$ | 120 | 50 | 60 | 1.0 |
| Invention sample 17 | $Al_2O_3$ | 120 | 50 | 70 | 2.5 |
| Comparative sample 1 | $Al_2O_3$ | 120 | 50 | 70 | 2.5 |
| Comparative sample 2 | $Al_2O_3$ | 120 | 50 | 70 | 2.5 |
| Comparative sample 3 | $Al_2O_3$ | 120 | 50 | 70 | 3.0 |
| Comparative sample 4 | $ZrO_2$ | 120 | 70 | 70 | 2.0 |
| Comparative sample 5 | $ZrO_2$ | 120 | 70 | 70 | 2.0 |
| Comparative sample 6 | $Al_2O_3$ | 120 | 50 | 60 | 1.0 |
| Comparative sample 7 | $Al_2O_3$ | 120 | 50 | 60 | 1.0 |
| Comparative sample 8 | $Al2O_3$ | 120 | 50 | 60 | 1.0 |
| Comparative sample 9 | $Al_2O_3$ | 100 | 40 | 50 | 1.0 |
| Comparative sample 10 | $Al_2O_3$ | 80 | 40 | 50 | 1.0 |
| Comparative sample 11 | $Al_2O_3$ | 120 | 50 | 70 | 2.5 |
| Comparative sample 12 | $Al_2O_3$ | 120 | 50 | 70 | 2.5 |
| Comparative sample 13 | $Al_2O_3$ | 120 | 50 | 60 | 1.0 |
| Comparative sample 14 | $Al_2O_3$ | 120 | 50 | 70 | 2.5 |

As to the obtained samples, an X-ray diffraction measurement by means of a 2θ/θ focusing optical system with Cu-Kα radiation was performed under the following conditions: an output: 50 kV, 250 mA; an incident-side solar slit: 5°; a divergence longitudinal slit: 2/3°; a divergence longitudinal limit slit: 5 mm; a scattering slit: 2/3°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 20°-155°. As to the apparatus, an X-ray diffractometer (model "RINT TTR III") manufactured by Rigaku Corporation was used. The peak intensity for each crystal plane of the α-type aluminum oxide layer and the TiCN layer was obtained from an X-ray diffraction pattern. A texture coefficient TC (1,2,11) in the α-type aluminum oxide layer and an intensity ratio $I_{311}/I_{220}$ of the TiCN layer were obtained from the resulting peak intensity for each crystal plane. The results are shown in Table 8.

TABLE 8

| Sample No. | α-type aluminum oxide layer TC (1, 2, 11) | TiCN layer $I_{311}/I_{220}$ |
|---|---|---|
| Invention sample 1 | 4.5 | 2.1 |
| Invention sample 2 | 5.5 | 7.5 |
| Invention sample 3 | 5.7 | 7.5 |
| Invention sample 4 | 6.4 | 13.2 |
| Invention sample 5 | 5.4 | 7.4 |
| Invention sample 6 | 3.3 | 1.5 |
| Invention sample 7 | 4.6 | 7.6 |
| Invention sample 8 | 1.5 | 1.1 |
| Invention sample 9 | 5.4 | 7.2 |
| Invention sample 10 | 5.5 | 7.5 |
| Invention sample 11 | 7.1 | 19.4 |
| Invention sample 12 | 4.5 | 7.5 |
| Invention sample 13 | 5.5 | 7.5 |
| Invention sample 14 | 7.1 | 7.5 |
| Invention sample 15 | 5.5 | 7.5 |
| Invention sample 16 | 5.5 | 7.5 |
| Invention sample 17 | 5.5 | 2.1 |
| Comparative sample 1 | 0.3 | 2.2 |
| Comparative sample 2 | 0.3 | 1.0 |
| Comparative sample 3 | 0.8 | 4.4 |
| Comparative sample 4 | 0.5 | 4.2 |
| Comparative sample 5 | 0.4 | 3.6 |
| Comparative sample 6 | 1.0 | 7.5 |
| Comparative sample 7 | 0.1 | 3.6 |
| Comparative sample 8 | 0.3 | 4.5 |
| Comparative sample 9 | 0.2 | 4.5 |
| Comparative sample 10 | 0.5 | 13.0 |

TABLE 8-continued

| Sample No. | α-type aluminum oxide layer TC (1, 2, 11) | TiCN layer $I_{311}/I_{220}$ |
|---|---|---|
| Comparative sample 11 | 0.3 | 7.5 |
| Comparative sample 12 | 0.3 | 7.5 |
| Comparative sample 13 | 0.3 | 7.5 |
| Comparative sample 14 | 0.3 | 2.1 |

The residual stress value of the α-type aluminum oxide layer in each of the obtained samples was measured by a $\sin^2\varphi$ method using an X-ray stress measuring apparatus (model "RINT TTR III" manufactured by Rigaku Corporation). The measurement results are shown in Table 9.

TABLE 9

| Sample No. | α-type aluminum oxide layer Residual stress value when measurement was performed with the selection of a (1, 1, 6) plane (MPa) |
|---|---|
| Invention sample 1 | −232 |
| Invention sample 2 | −224 |
| Invention sample 3 | −295 |
| Invention sample 4 | −106 |
| Invention sample 5 | −94 |
| Invention sample 6 | 150 |
| Invention sample 7 | 168 |
| Invention sample 8 | 290 |
| Invention sample 9 | 272 |
| Invention sample 10 | −410 |
| Invention sample 11 | 54 |
| Invention sample 12 | −230 |
| Invention sample 13 | −230 |
| Invention sample 14 | −230 |
| Invention sample 15 | −230 |
| Invention sample 16 | 150 |
| Invention sample 17 | −230 |
| Comparative sample 1 | −240 |
| Comparative sample 2 | −225 |
| Comparative sample 3 | −302 |
| Comparative sample 4 | −114 |
| Comparative sample 5 | −105 |
| Comparative sample 6 | 148 |
| Comparative sample 7 | 160 |
| Comparative sample 8 | 298 |
| Comparative sample 9 | 278 |
| Comparative sample 10 | 350 |
| Comparative sample 11 | −230 |
| Comparative sample 12 | −230 |
| Comparative sample 13 | 150 |
| Comparative sample 14 | −230 |

Cutting tests 1 and 2 were conducted using the obtained samples under the following conditions. Cutting test 1 is a wear test for evaluating wear resistance, and cutting test 2 is a fracture test for evaluating fracture resistance. The results of the respective cutting tests are shown in Table 10.

[Cutting Test 1]
Workpiece material: S45C round bar
Cutting speed: 310 m/min
Feed: 0.30 mm/rev
Depth of cut: 2.0 mm
Coolant: used
Evaluation items: A time when a sample was fractured or had a maximum flank wear width of 0.2 mm was defined as the end of the tool life, and the machining time to reach the end of the tool life was measured.

[Cutting Test 2]
Workpiece material: SCM415 round bar with two equidistant grooves extending in the length direction
Cutting speed: 240 m/min
Feed: 0.40 mm/rev
Depth of cut: 1.5 mm
Coolant: used
Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the number of contacts reached 20,000 at a maximum. In other words, the number "20,000" for the tool life indicates that the end of the tool life was not reached even after the arrival of 20,000 shocks. It should be noted that, as to each sample, five inserts were prepared and the number of shocks was measured for each of such cutting inserts, and the arithmetic mean was obtained from the measurements of the number of shocks so as to serve as the tool life.

As to the machining time to reach the end of the tool life in cutting test 1 (wear test), evaluations were made with grade "A" for 30 minutes or more, grade "B" for 25 minutes or more and less than 30 minutes, and grade "C" for less than 25 minutes. Further, as to the number of shocks until the end of the tool life in cutting test 2 (fracture test), evaluations were made with grade "A" for 15,000 or more, grade "B" for 12,000 or more and less than 15,000, and grade "C" for less than 12,000. In such evaluations, "A" refers to excellent, "B" refers to good and "C" refers to inferior, meaning that a sample involving a larger number of "A"s or "B"s has more excellent cutting performance. The resulting evaluation results are shown in Table 10.

TABLE 10

| Sample No. | Wear test Tool life (min) | Grade | Damage form | Fracture test Tool life (shocks) | Grade |
|---|---|---|---|---|---|
| Invention sample 1 | 25 | B | Normal wear | 20,000 | A |
| Invention sample 2 | 31 | A | Normal wear | 18,600 | A |
| Invention sample 3 | 34 | A | Normal wear | 20,000 | A |
| Invention sample 4 | 48 | A | Normal wear | 15,400 | A |
| Invention sample 5 | 35 | A | Normal wear | 19,200 | A |
| Invention sample 6 | 28 | B | Normal wear | 16,000 | A |
| Invention sample 7 | 34 | A | Normal wear | 15,800 | A |
| Invention sample 8 | 32 | A | Normal wear | 15,000 | A |
| Invention sample 9 | 26 | B | Normal wear | 16,200 | A |
| Invention sample 10 | 40 | A | Normal wear | 17,900 | A |
| Invention sample 11 | 25 | B | Normal wear | 18,500 | A |
| Invention sample 12 | 29 | B | Normal wear | 18,600 | A |
| Invention sample 13 | 33 | A | Normal wear | 19,200 | A |
| Invention sample 14 | 38 | A | Normal wear | 20,000 | A |
| Invention sample 15 | 27 | B | Normal wear | 17,900 | A |
| Invention sample 16 | 32 | A | Normal wear | 16,100 | A |
| Invention sample 17 | 30 | A | Normal wear | 18,300 | A |
| Comparative sample 1 | 17 | C | Normal wear | 19,600 | A |
| Comparative sample 2 | 20 | C | Normal wear | 15,200 | A |
| Comparative sample 3 | 22 | C | Normal wear | 13,800 | B |
| Comparative sample 4 | 10 | C | Normal wear | 17,800 | A |
| Comparative sample 5 | 17 | C | Normal wear | 17,400 | A |
| Comparative sample 6 | 23 | C | Normal wear | 14,500 | B |
| Comparative sample 7 | 20 | C | Normal wear | 14,000 | B |
| Comparative sample 8 | 20 | C | Fracturing | 7,400 | C |
| Comparative sample 9 | 20 | C | Normal wear | 8,500 | C |
| Comparative sample 10 | 23 | C | Fracturing | 9,600 | C |
| Comparative sample 11 | 22 | C | Normal wear | 14,000 | B |
| Comparative sample 12 | 19 | C | Normal wear | 12,900 | B |
| Comparative sample 13 | 18 | C | Fracturing | 9,100 | C |
| Comparative sample 14 | 20 | C | Normal wear | 13,400 | B |

The results of Table 10 show that each invention sample had grade "B" or higher in the wear test and also show that each invention sample had grade "A" in the fracture test. Meanwhile, as to the evaluations on the comparative samples, each comparative sample had grade "C" in either the wear test or the fracture test. In particular, in the wear test, each invention sample had grade "B" or higher and each comparative sample had grade "B" or "C." Accordingly, it is apparent that the wear resistance of each invention sample is more excellent than that of each comparative sample.

It is apparent from the above results that each invention sample has excellent wear resistance and fracture resistance, resulting in a longer tool life.

The present application is based on the Japanese patent application filed on Oct. 21, 2016 (JP Appl. 2016-206801), the content of which is incorporated herein by reference.

INDUSTRIAL APPLICABILITY

As to a coated cutting tool according to the present invention, such coated cutting tool does not involve a reduction in wear resistance and has excellent fracture resistance, so that the tool life can be extended more than that involved in the prior art, and, from such perspective, the coated cutting tool has industrial applicability.

What is claimed is:

1. A coated cutting tool comprising:
a substrate and a coating layer formed on a surface of the substrate, the coating layer including in this order from the substrate side:
a TiCN layer;
an intermediate layer comprised of a compound of at least one kind selected from the group consisting of a Ti carbonate, a Ti oxynitride and a Ti carboxynitride; and
at least one α-type aluminum oxide layer, wherein,
in the α-type aluminum oxide layer, a texture coefficient TC (1,2,11) of a (1,2,11) plane represented by formula (1) below is 1.4 or more,
an average thickness of the α-type aluminum oxide layer is from 1.0 μm or more to 15.0 μm or less, and
a residual stress value in a (1,1,6) plane of the α-type aluminum oxide layer is, in at least part thereof, from −300 MPa or higher to 300 MPa or lower, $$TC(1,2,11) = \frac{I(1,2,11)}{I_0(1,2,11)} \left\{ \frac{1}{8} \sum \frac{I(h,k,l)}{I_0(h,k,l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to eight crystal planes of (0,1,2), (1,0,4), (1,1,0), (1,1,3), (0,2,4), (1,1,6), (2,1,4) and (1,2,11).

2. The coated cutting tool according to claim 1, wherein, in the α-type aluminum oxide layer, the texture coefficient TC (1,2,11) is from 2.0 or more to 6.9 or less.

3. The coated cutting tool according to claim 1, wherein a ratio $I_{311}/I_{220}$ of a peak intensity $I_{311}$ for a (3,1,1) plane in X-ray diffraction of the TiCN layer to a peak intensity $I_{220}$ for a (2,2,0) plane in X-ray diffraction of the TiCN layer is from 1.5 or more to 20.0 or less.

4. The coated cutting tool according to claim 3, wherein an average thickness of the TiCN layer is from 2.0 μm or more to 20.0 μm or less.

5. The coated cutting tool according to claim 1, wherein an average thickness of the coating layer is from 3.0 μm or more to 30.0 μm or less.

6. The coated cutting tool according to claim 1, wherein the coating layer comprises a TiN layer as an outermost layer on a side opposite to the substrate.

7. The coated cutting tool according to claim 1, wherein the substrate is comprised of any of a cemented carbide, cermet, ceramics and a sintered body containing cubic boron nitride.

8. The coated cutting tool according to claim 2, wherein a ratio $I_{311}/I_{220}$ of a peak intensity $I_{311}$ for a (3,1,1) plane in X-ray diffraction of the TiCN layer to a peak intensity $I_{220}$ for a (2,2,0) plane in X-ray diffraction of the TiCN layer is from 1.5 or more to 20.0 or less.

9. The coated cutting tool according to claim 2, wherein an average thickness of the coating layer is from 3.0 μm or more to 30.0 μm or less.

* * * * *